(12) United States Patent
Samuels

(10) Patent No.: US 6,327,544 B1
(45) Date of Patent: Dec. 4, 2001

(54) AUTOMATIC STORAGE OF A TRIGGER DEFINITION IN A SIGNAL MEASUREMENT SYSTEM

(75) Inventor: Mason B. Samuels, Colorado Springs, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/260,263

(22) Filed: Mar. 1, 1999

(51) Int. Cl.[7] .............................. G06F 19/00; G06F 15/00
(52) U.S. Cl. .............................. 702/70; 345/501; 702/70; 714/724; 714/736
(58) Field of Search .................. 702/70, 68; 364/579, 364/900; 375/10; 345/400; 717/4, 5, 39; 714/724; 708/212

(56) References Cited

U.S. PATENT DOCUMENTS

| | | | |
|---|---|---|---|
| 4,493,044 | 1/1985 | Hoeren et al. | 364/579 |
| 4,513,395 | 4/1985 | Henry et al. | 364/900 |
| 4,541,100 | 9/1985 | Sutton et al. | 375/10 |
| 4,623,984 | 11/1986 | Yokokawa et al. | 364/900 |
| 4,636,940 * | 1/1987 | Goodwin, Jr. | 717/4 |
| 4,654,848 | 3/1987 | Noguchi | 371/20 |
| 4,748,624 * | 5/1988 | Sugimori et al. | 714/39 |
| 4,907,229 * | 3/1990 | Edwards et al. | 714/37 |
| 5,031,128 * | 7/1991 | Boutiny et al. | 708/212 |
| 5,067,130 | 11/1991 | Jackson | 371/22.1 |
| 5,282,213 * | 1/1994 | Leigh et al. | 714/724 |
| 5,321,701 * | 6/1994 | Raymond et al. | 714/736 |
| 5,347,540 | 9/1994 | Karrick | 375/10 |
| 5,446,650 * | 8/1995 | Overhage et al. | 702/68 |
| 5,790,133 * | 8/1998 | Holcomb et al. | 345/501 |

* cited by examiner

*Primary Examiner*—Arthur T. Grimley
*Assistant Examiner*—Mohamed Charioui

(57) ABSTRACT

An automatic save and recall system and method for use in signal measurement systems that acquire and store signal data in accordance with a trigger specification, including generally a trigger definition and trigger control parameters ("trigger controls"). The present invention automatically stores in memory ("saves") trigger-related data that includes, for example, a current trigger definition and other specified portions of a trigger specification ("saved trigger specifications") without an explicit operator request. A plurality of such saved trigger specifications are subsequently available for retrieval from memory ("recall"). This enables an operator to easily return to a previous version of a trigger definition should the operator determine that a current trigger definition is undesirable. The automatic storing of trigger specifications (or portions thereof) may occur in response to one or more predetermined event(s). In one aspect of the invention, such predetermined event(s) include the operator's attempt to acquire data. Significantly, this aspect of the present invention anticipates the operator's needs to save a trigger definition since trigger definitions that are utilized to acquire data are potentially important to the operator. That is, this aspect of the present invention takes advantage of the inherent correlation between a trigger definition that is invoked and the importance of such a trigger definition in the development of a desired trigger specification.

36 Claims, 10 Drawing Sheets

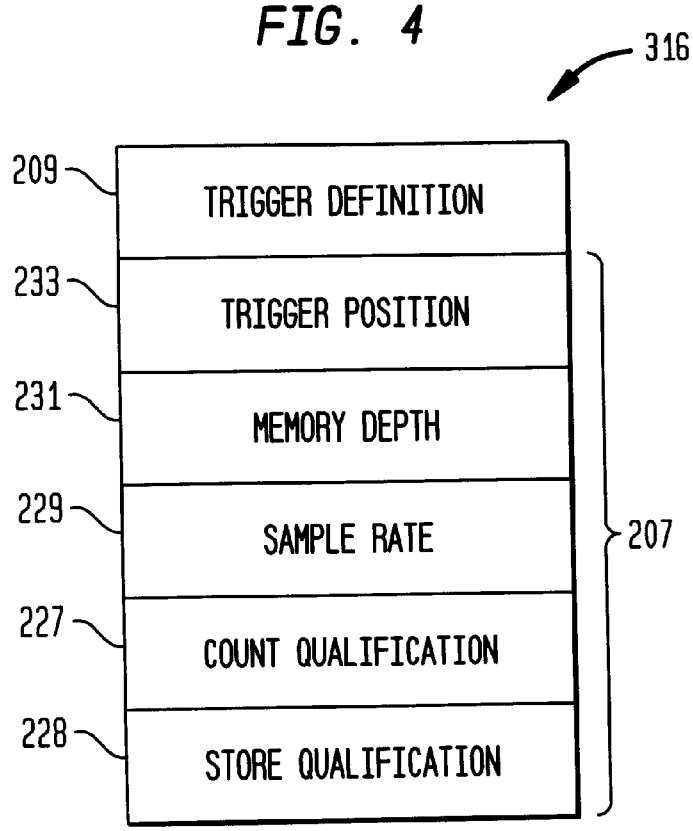

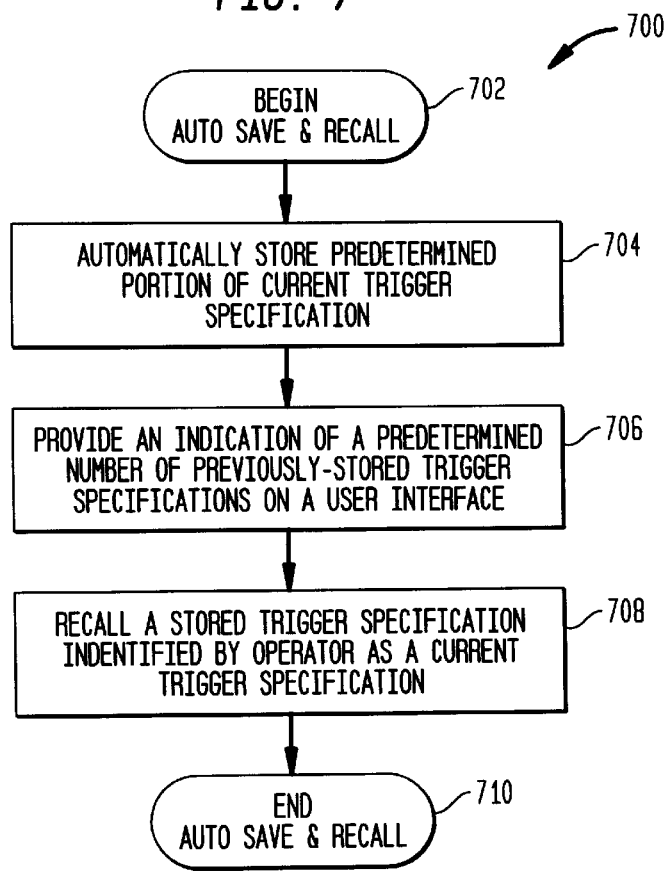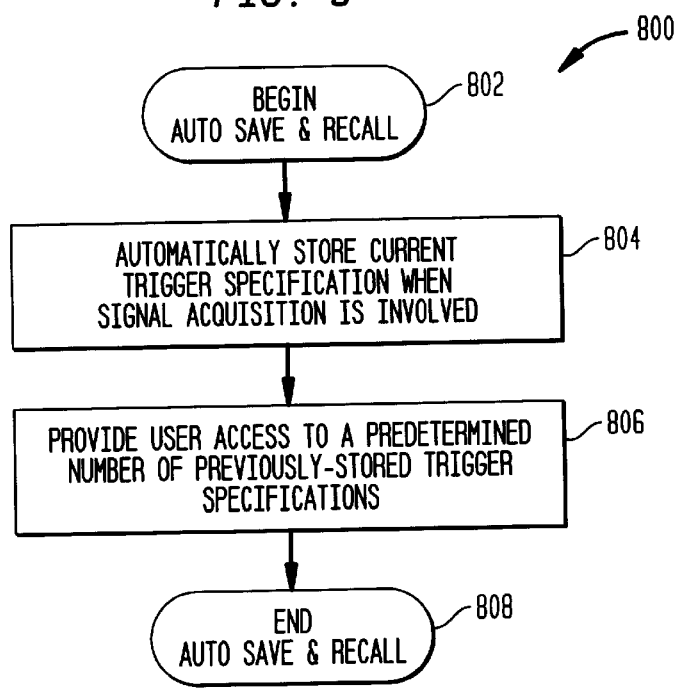

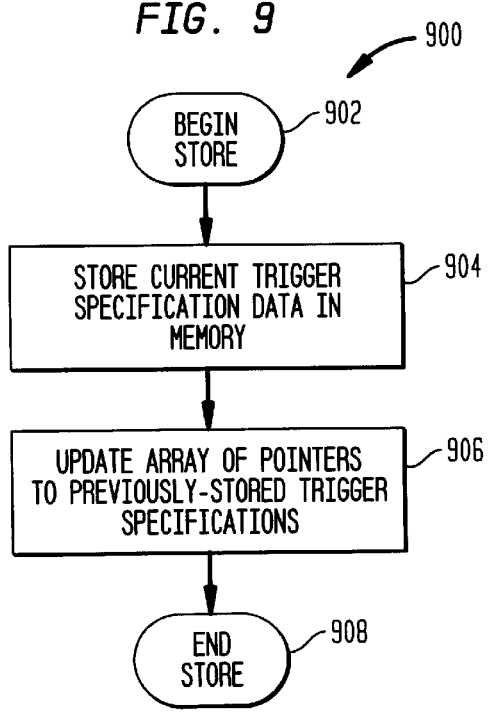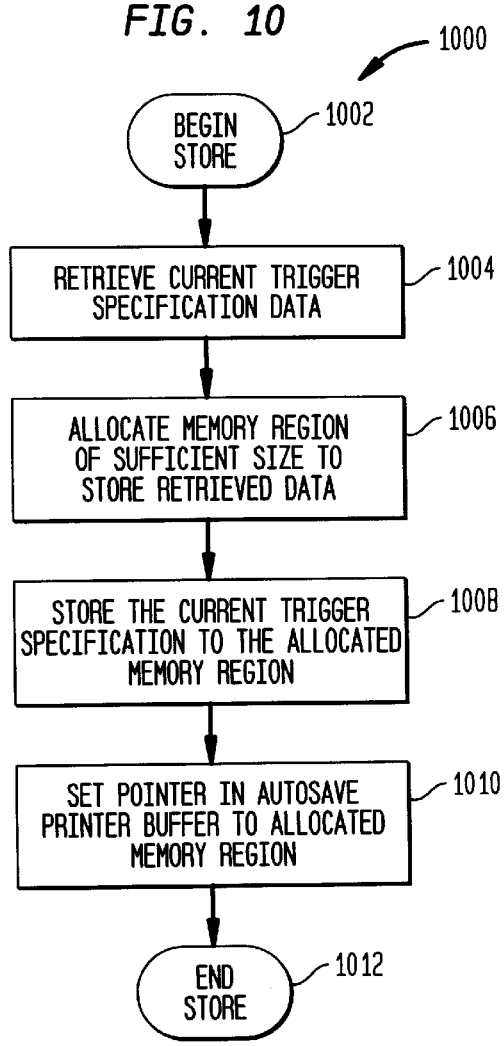

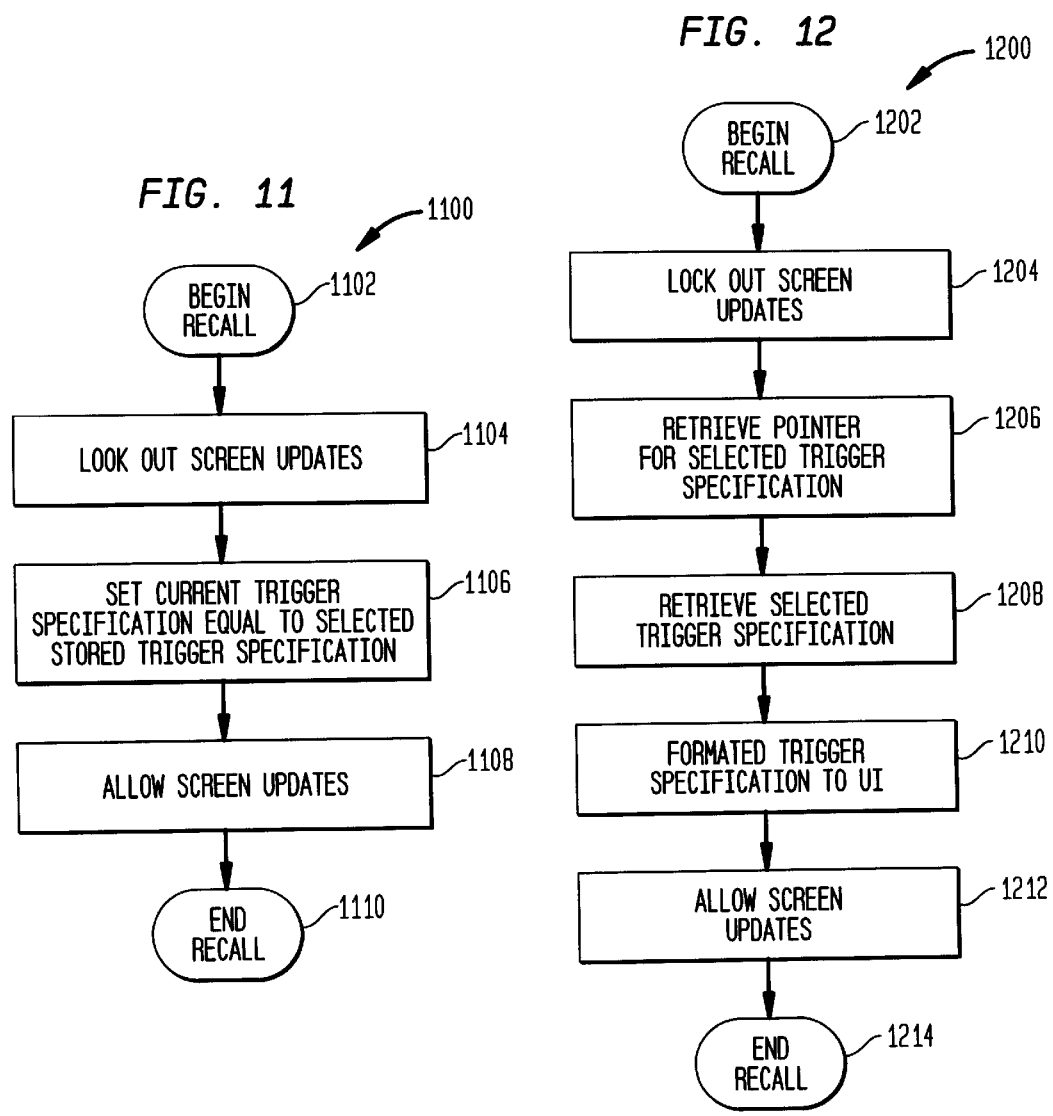

AUTOMATIC STORAGE OF A TRIGGER DEFINITION IN A SIGNAL MEASUREMENT SYSTEM

BACKGROUND OF THE INVENTION

1. Field of the Invention

The present invention relates generally to signal measurement systems and, more particularly, to storing trigger specifications in a signal measurement system.

2. Related Art

Analyzers and testers are commonly available to assist in the development, manufacturing and troubleshooting of complex digital electronic/software devices and integrated circuits having incorporated therein microprocessors, random-access memories (RAM), read-only memories (ROM), and other circuits. Such analyzers and testers, generally referred to as signal measurement systems herein, include logic analyzers, digital oscilloscopes, protocol analyzers, microprocessor emulators, bit error rate testers, network analyzers, among other instruments. Logic analyzers in particular have emerged for this purpose and are commercially available from a number of vendors, such as Hewlett-Packard Company, Tektronix, Inc., and others.

Logic analyzers are digital data acquisition instruments that allow an operator to acquire and display digital signal data from a large number of logic signals ("signals"), such as those that travel over address, data and control lines of a device under test (DUT). A device under test may include one or more separately packaged devices such as those noted above, as well as other circuits and devices.

The signals are acquired from the device under test on hardwired lines referred to as channels. The channels may be physically assembled into groups commonly referred to as pods. The received signals are sampled and digitized to form signal data. Digitizing typically includes comparing a voltage magnitude of each logic signal sample to a reference voltage threshold to determine the logic state of the signal. Sampling may occur at one of a number of selectable rates, depending on the frequency at which the sampled signals change logic states. The resultant signal data are stored, under the control of a sampling clock, in a signal data memory generally having a fixed size. The data are typically stored in a sequential manner such that consecutive signal samples are stored in consecutive memory locations. Due to the quantity of signal data, signal data memory is commonly implemented as a wrap-around buffer.

Selection of the portion of the signal data that is separately stored and subsequently presented on the display is determined by an operator-defined trigger specification. The trigger specification (also referred to as a trigger set-up) is specified generally by a trigger definition and a number of parameters, collectively referred to herein as trigger control parameters or, simply, trigger controls. The trigger definition identifies the occurrences under which signal data is to be stored. The trigger controls identify the characteristics of the captured signal data including, for example, the relative position of the occurrence defined by the trigger definition and the signal data to be stored. A predetermined quantity of signal data occurring before and after the specified occurrence is then stored in memory for subsequent analysis.

A trigger definition, also referred to as a trigger sequence, is comprised of one or more trigger sequence levels. Each sequence level may include any number of trigger branches each of which sets forth a branch condition that causes the logic analyzer to execute the action defined in that trigger branch. Such execution results in the storage of signal data or further processing of a subsequent sequence level. The final branch condition that causes the acquisition of signal data is commonly referred to as a trigger condition.

Branch conditions are specified by the occurrence of one or more events. An event is defined as an occurrence of certain characteristics or properties of a signal, such as a rising or falling edge, a logic high or logic low signal state, etc. Events may also be defined based on internal resources, such internal timers, counters, etc. Typically, a branch condition specifies a number of events that occur simultaneously or in a relative time sequence.

After the trigger specification is specified, the operator can perform a measurement; that is, initiate acquisition of signal samples. When signal data capture is initiated, the signal data is compared to the specified trigger definition. When the trigger definition is satisfied, the signal data is captured in accordance with the specified trigger controls. Subsequently, the signal data memory may be sequentially accessed and signal data displayed.

Constructing a proper trigger definition can be very complicated and time consuming. A common approach to developing a trigger definition is to construct and test individual portions of a trigger definition at a given time. As each portion is verified, additional layers of complexity are added to the previously verified trigger definition. For example, operators often begin trigger specification development with a simple trigger definition, perform an acquisition, and examine the captured data. If the results are as anticipated, then the operator adds another portion; that is, a branch or an event, to the trigger definition, to further define the trigger definition so as to capture the desired information. If the branch condition does not operate as desired, the operator will eliminate one or more of the recently-added portions of the trigger definition in an attempt to return to a trigger definition that is known to operate as desired. The operator may then perform another attempt to develop the next branch condition. This process is repeated until the current portion of the trigger definition operates as anticipated before additional layers of complexity are added.

However, it is often difficult to recall which aspects of a trigger definition have changed during a number of past acquisitions, which branch conditions successively acquired data, etc. Oftentimes, a number of events have been added or previous events and conditions have been modified. As a result, operators often spend considerable time evaluating past acquisitions, inevitably repeating prior work developing portions of a trigger definition that were previously verified. Not only are such activities time consuming, they often prevent novice operators that are not familiar with the triggering process from invoking useful acquisitions without further assistance or guidance from a more experienced operator. This is problematic in that a more experienced operator may not be available and the labor costs associated with the measurement increase significantly.

One solution has been to utilize the assistance of a common feature in conventional logic analyzers that provides the operator with an opportunity to store and subsequently retrieve from memory a predetermined number of selected trigger specifications. Generally, such functions require the operator to perform a number of explicit actions to store a trigger specification. For example, it is not uncommon for an operator to have to invoke a save trigger specification function through the implementation of a separate dedicated button, soft key, GUI button or menu item, etc. Oftentimes, the operator must first navigate through a series of soft key menus or GUI windows to arrive at the appropriate logical location that contains this save function interface. Once selected, the operator must assign a name or other identifier to the trigger specification which is to be saved. After the trigger specification is saved, the operator then again navigates to the soft key menu or GUI window to perform additional trigger definition development.

This process is difficult for the novice operator to utilize as well as inconvenient and distracting for an experienced operator. In particular, a novice operator often does not realize that a particular branch condition will not operate as anticipated, or does not recall the availability of the trigger definition save functionality. As a result, novice operators often inadvertently create a trigger specification that does not capture the desired data and from which the operator cannot easily recover. Thus, a typical novice operator typically spends considerable time and effort editing the current, non-functional trigger definition to eliminate the problematic branch conditions, only to have to once again develop another addition to the trigger specification, the success of which is uncertain.

It also poses problems for a more experienced operator that is attempting to develop a complex trigger definition. Experienced operators often find themselves in a circumstance where they have progressed significantly beyond, and wish to return to, an unsaved trigger definition, and are unable to do so due to the complexity of the trigger definition, the time elapsed since the prior version of the trigger definition was saved by the operator or, if not saved, since the creation of the definition, and the number of aspects of the trigger definition which have been added or modified. Thus, operators of conventional signal measurement systems generally, and logic analyzers in particular, are constantly faced with the prospect of having to remember to identify important trigger definitions that they may want or need to use again during a trigger definition development process. Operators must also continually have the forethought to save such important trigger definitions or be able to distinguish at some later time between those aspects of a trigger definition that acquire data as anticipated, and those that do not. As noted, such a burden adversely affects the efficiency with which the logic analyzer is utilized.

SUMMARY OF THE INVENTION

The present invention is a system and method for use in signal measurement systems that acquire and store signal data in accordance with a trigger specification, including generally a trigger definition and trigger control parameters ("trigger controls"). The present invention automatically stores in memory ("saves") trigger-related data that includes, for example, a current trigger definition and other specified portions of a trigger specification ("saved trigger specifications") without an explicit operator request. A plurality of such saved trigger specifications are subsequently available for retrieval from memory ("recall"). This enables an operator to easily return to a previous version of a trigger definition should the operator determine that a current trigger definition is undesirable. The automatic storing of trigger specifications (or portions thereof) may occur in response to one or more predetermined event(s). In one aspect of the invention, such predetermined event(s) include the operator's attempt to acquire data upon which trigger definitions are saved. Significantly, this aspect of the present invention anticipates the operator's needs to save a trigger definition since trigger definitions that are utilized to acquire data are potentially important to the operator. That is, this aspect of the present invention takes advantage of the inherent correlation between a trigger definition that is invoked and the importance of such a trigger definition in the development of a desired trigger specification.

A number of aspects of the invention are summarized below, along with different embodiments of each of the summarized aspects. It should be understood that the embodiments are not necessarily inclusive or exclusive of each other and may be combined in any manner that is non-conflicting and otherwise possible, whether they be presented in association with a same or different aspect of the invention. It should also be understood that these summarized aspects of the invention are exemplary only and are considered to be non-limiting.

In one aspect of the present invention a system for use in a signal measurement system that acquires and stores signal data in accordance with a current trigger specification is disclosed. The system is constructed and arranged to automatically save a specified portion of the current trigger specification in response to an occurrence of a predetermined store condition. The predetermined store condition does not include operator requests to store the current trigger specification. The system also provides subsequent access to a predetermined number of the specified trigger specification portions for subsequent recall. Preferably, the predetermined store condition is an operator's attempt to acquire data.

In another aspect of the invention an auto save and recall system for use in a signal measurement system that acquires and stores signal data in accordance with a trigger specification is disclosed. The system is constructed and arranged to store a predefined portion of a current trigger specification automatically and in response to operator-invoked requests, and to provide operator access to a predetermined number of the stored predefined trigger specification portions for subsequent recall and use by the operator.

In a still further aspect of the invention, an auto save system for use in a signal measurement system such as a logic analyzer or digital oscilloscope that acquires and stores signal data in accordance with a trigger specification, the signal measurement system having a user interface and a memory device. The system automatically stores current trigger-related data in a memory operationally coupled to the system. A predetermined number of such trigger-related data are stored for subsequent recall from memory.

The auto save system stores the trigger-related data in response to an occurrence of a predetermined store condition that expressly excludes operator actions to store the trigger-related data such as an operator request to acquire signal data or passage of a predetermined interval of time. The trigger-related data may include a portion of a current trigger specification such as a current trigger definition defining a trigger sequence currently displayed on the user interface when the operator runs a measurement. The trigger-related data may also include one or more current trigger control parameters which define a manner in which signal data is stored. Trigger control parameters may include, for example, a trigger position defining a relative position of the trigger condition and the signal data that is stored, a memory depth identifying a quantity of signal data that is to be stored in the memory device upon the occurrence of the store condition or a sample rate identifying a frequency at which the signal data is sampled and stored upon the occurrence of the store condition, among others.

In one embodiment, the system includes an auto store controller constructed and arranged to receive one or more inputs identifying events defining the predetermined store condition. The auto store controller is also constructed and arranged to store in a region of the memory device the trigger-related data when the one or more received events indicate an occurrence of the predetermined store condition. The system also includes a recall controller constructed and arranged to retrieve from one of a plurality of memory device regions operator-specified trigger-related data associated with a previous occurrence of the store condition, and to provide the retrieved trigger-related data to the user interface.

Certain embodiments also include a pointer array, accessible by the auto store controller and the recall controller. The pointer array includes pointers, each identifying one of said plurality of memory device regions. The pointer array also includes trigger names each associated with one of the pointers and providing a description of the trigger-related data stored in the memory device region identified by the associated pointer. The trigger names preferably indicate a relative sequence in which the corresponding trigger-related data have been stored. In such embodiments, a pointer buffer controller constructed and arranged to maintain an association between the trigger names and the pointers in the pointer array such that the trigger names reflect the relative sequence in which the corresponding trigger-related data has been stored may also be included.

In a different aspect of the invention, a method for automatically saving and subsequently recalling a trigger definition in a signal measurement system that acquires and stores signal data in accordance with a trigger specification including a trigger definition and one or more trigger control parameters is disclosed. The method includes the steps of: 1) storing automatically a current trigger definition in response to a predetermined number of most recent signal acquisition requests; and 2) providing an operator access to the predetermined number of previously-stored trigger definitions. Preferably, the method also includes the steps of: a) storing the trigger definition in a region of a memory device; and b) updating a pointer array to reflect the storage of the current trigger definition, the pointer array having stored therein pointers to memory regions in which trigger definitions are stored and names, each associated with and identifying a corresponding trigger definition.

In certain embodiments, step 1) includes the steps of: a) identifying an automatic store condition, the automatic store condition explicitly excluding operator invocation or other operator action associated with the storage of a trigger definition; b) allocating a region of system memory of sufficient size to store the trigger definition; c) storing the trigger definition in the allocated memory region; and e) setting a pointer in the pointer array to point to the allocated memory region. In other embodiments, step 2) includes the steps of: a) receive an operator request to recall a specific trigger definition; and b) equating a current trigger definition to the selected stored trigger definition. Preferably, before step b) the step of c) preventing screen updates to a user interface and after step b), the step of d) allowing the screen updates are performed.

In another aspect of the invention, a method for automatically saving and recalling trigger-related data in a signal measurement system that acquires and stores signal data in accordance with a trigger specification is disclosed. The method includes the steps of: 1) storing automatically trigger-related data that includes at least a trigger definition in a memory device in response to an occurrence of a predetermined store condition that explicitly excludes operator invocation or other action associated with the storage of a trigger definition; 2) providing an indication of a predetermined number of previously-stored trigger-related data on a user interface, each of the previously-stored trigger-related data stored in response to a prior occurrence of the predetermined store condition; 3) retrieving from the memory one of the predetermined number of previously-stored trigger related data identified by the operator; and 4) updating a current trigger specification to include the retrieved trigger-related data.

In a still further aspect of the invention, a method for automatically saving and recalling trigger-related data in a signal measurement system that acquires and stores signal data in accordance with a trigger specification, the signal measurement system having a graphical user interface. The method includes the steps of: 1) displaying on the graphical user interface a user-interactive trigger definition edit region; 2) receiving operator's inputs to a current trigger specification having a trigger definition displayed in the trigger definition edit region; 3) storing the current trigger definition including the trigger definition displayed in the trigger definition edit region to memory upon an occurrence of a signal acquisition request; and 4) displaying an indication of previously stored trigger specifications on the graphical user interface. In certain embodiments, the method also includes the steps of: 5) receiving a graphical selection input identifying specific trigger-related data; 6) retrieving the selected trigger-related data; and 7) displaying the trigger definition included in the retrieved trigger-related data in the trigger definition edit region of a current trigger definition.

In another aspect of the invention, an auto save system for use in a signal measurement system that acquires and stores signal data in accordance with a trigger specification, the signal measurement system having a user interface and a memory device is disclosed. The system is constructed and arranged to automatically store, in response to an occurrence of an operator request to acquire signal data, a current trigger specification in a memory operationally coupled to the system, and to store a predetermined number of the trigger specifications for subsequent recall from memory. The system includes an auto store controller constructed and arranged to receive one or more inputs identifying events defining the predetermined store condition, and to store in a region of the memory device the trigger-related data when the one or more received events indicate an occurrence of the predetermined store condition. The system also includes a recall controller constructed and arranged to retrieve from the memory device region operator-specified trigger-related data and to provide the retrieved trigger-related data to the user interface.

In certain embodiments of this aspect of the invention, the system further includes a pointer array operatively coupled to the auto store controller and the recall controller. The pointer array includes pointers to memory device regions in which are stored trigger specifications that were saved in response to a predetermined number of prior signal acquisition requests. The pointer array also includes trigger names each identifying a relative sequence in which trigger specifications corresponding to an associated pointer have been saved. Certain implementations of this embodiment include a pointer buffer controller constructed and arranged to maintain an association between the trigger names and the pointers in the pointer array such that the trigger names reflect the relative sequence in which the corresponding trigger-related data has been stored.

Various embodiments of the present invention provide certain advantages and overcome certain drawbacks of the conventional techniques. Not all embodiments of the invention share the same advantages and those that do may not share them under all circumstances. This being said, the present invention provides numerous advantages including the noted advantage of automatically storing a trigger definition, a greater portion of a trigger specification, or other trigger-related data when a predetermined event occurs, such as events indicative of potentially important trigger definitions, completely without intervention or invocation by the operator. This substantially advances the efficiency with which novice and sophisticated operators create trigger specifications.

Further features and advantages of the present invention as well as the structure and operation of various embodiments of the present invention are described in detail below with reference to the accompanying drawings. In the drawings, like reference numerals indicate identical or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 4 is a schematic diagram of a trigger specification stored in memory in accordance with one embodiment of the present invention.

FIG. 5 is a schematic diagram of a pointer array maintained in certain aspects of the present invention.

FIG. 7 is a high level flow chart of automatic save and recall processes performed in accordance with one embodiment of the present invention.

FIG. 8 is a high level flow chart of an alternative embodiment of processes performed to automatically save and recall predetermined portions of a trigger specification.

FIG. 9 is a high level flow chart of the processes performed in accordance with one embodiment of the present invention to automatically store a trigger specification.

FIG. 10 is a detailed flow chart of the processes performed in accordance with one embodiment of the present invention to automatically store a trigger specification.

FIG. 11 is a high level flow chart of the processes performed by the present invention to recall a previously saved trigger specification.

FIG. 12 is a detailed flow chart of the processes performed by the present invention to recall a previously saved trigger specification.

DETAILED DESCRIPTION

The present invention is a system and method for use in a signal measurement system that acquires and stores signal data in accordance with a trigger specification, including a trigger definition and one or more trigger control parameters ("trigger controls"). The present invention automatically stores in memory ("saves") trigger-related data that includes trigger definitions and other specified portions of a current trigger specification ("saved trigger specifications"), without operator invocation or other involvement. A plurality of such saved trigger specifications are subsequently made available for retrieval from memory ("recall"). This enables an operator to easily return to a previous version of a trigger definition should the operator determine that a current trigger definition is undesirable. The automatic storing of trigger specifications (or portions thereof) may occur in response to one or more predetermined event(s). In one aspect of the invention, such predetermined event(s) include the operator's attempt to acquire data. Significantly, this aspect of the present invention anticipates the operator's needs to save a trigger definition since trigger definitions that are utilized to acquire data are potentially important to the operator. That is, this aspect of the present invention takes advantage of the inherent correlation between an invoked trigger definition and the importance of the trigger definition in the development of a desired trigger specification.

Figure 1:
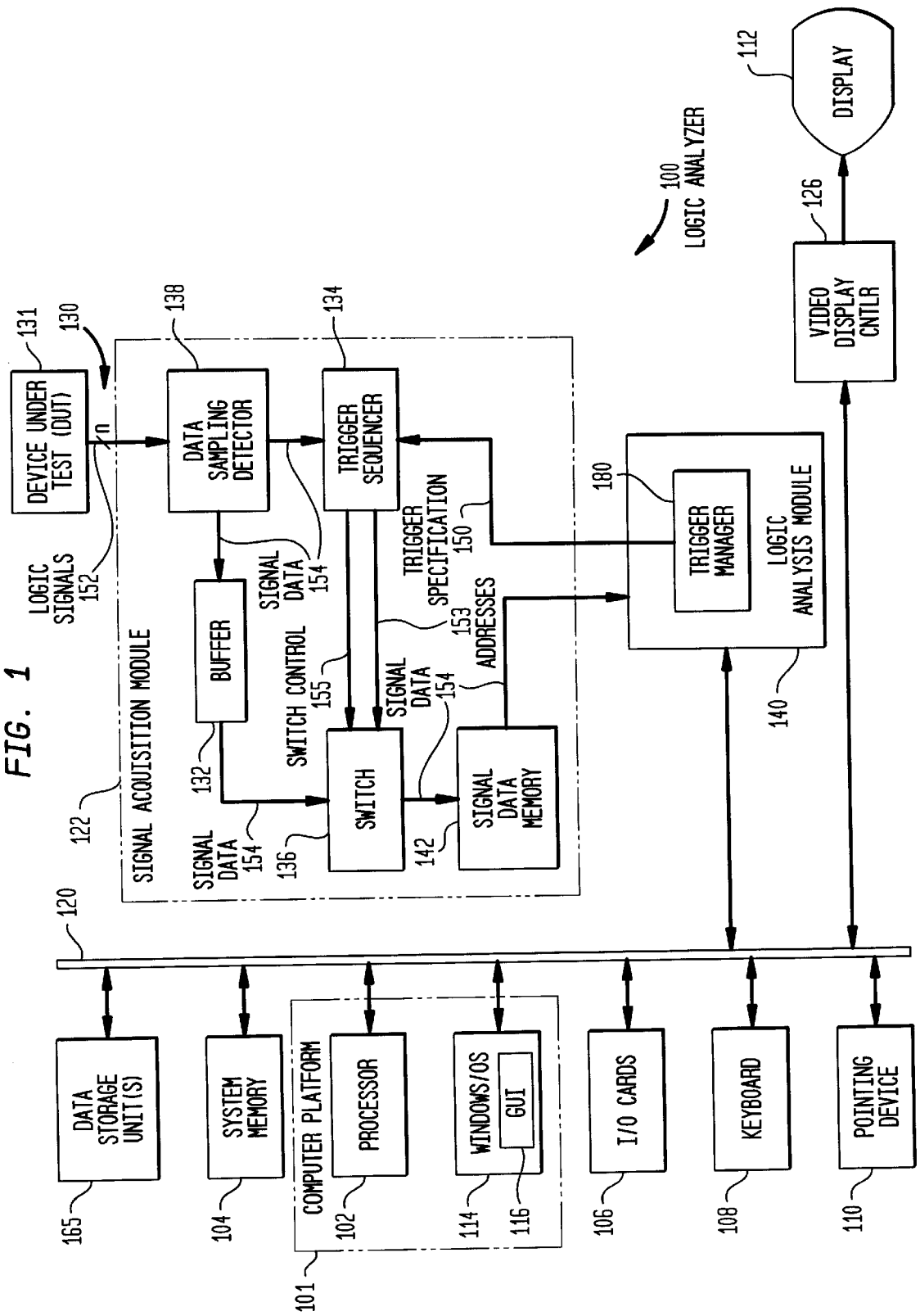
FIG. 1 is a functional block diagram of an exemplary logic analyzer in which embodiments of the present invention may be implemented.

As noted, the present invention may be implemented in any signal measurement system that acquires signal data in accordance with a trigger specification. Aspects of the present invention will be described with reference to exemplary signal measurement system, a logic analyzer. FIG. 1 is a functional block diagram of such a logic analyzer.

Logic analyzer 100 acquires, analyzes and displays a wide variety of signals generally in terms of the logic level of the signals versus time. In the illustrative embodiment shown in FIG. 1, logic analyzer 100 includes a general purpose computer system which is programmable using a high level computer programming language, and specially programmed, special purpose hardware for performing signal acquisition, analysis and display functions. It should become apparent from the following description that the present invention may be implemented in other environments such as a special purpose program operating on an on-board processors, ASICs, firmware, hardware, or a combination thereof.

Logic analyzer 100 includes processor 102, system memory 104, input/output (I/O) cards 106, storage units 105 such as a hard disk drive, floppy disk drive, etc. Analyzer 100 may also include one or more user input/output devices such as keyboard 108, pointing devices 110 and display 112. System memory 104 is used for storage of program instructions in addition to other computer-readable programs and data. In a preferred embodiment, system memory 104 includes random access memory (RAM). Display 112 is preferably a cathode ray display and is logically or physically divided into an array of picture elements (pixels). Input/output (I/O) interface cards 106 may be modem cards, network interface cards, sound cards, and the like.

Processor 102 is typically a commercially available processor, such as the PA-RISC processor from Hewlett-Packard Company, Pentium microprocessor from Intel Corporation, or PowerPC and 68000 series microprocessors from Motorola. Many other processors are also available. Such a processor executes a program referred to as an operating system 114, providing a graphical user interface (GUI) 116 and a windowing system, such as the various versions of the Windows operating systems from Microsoft Corporation, the NetWare operating system available from Novell, Inc., or the Unix operating system available from many vendors such as Sun Microsystems, Inc., Hewlett-Packard Company and AT&T. The operating system 114 controls the execution of other computer programs such as software embodiments of logic analysis module 140, and provides scheduling, input-output control, file and data management, memory management, and communication control and related services. Processor 102 and operating system 114, generally define a computer platform shown by dashed block 101, for which application programs in high level programming languages may be written. The functional elements of logic analyzer 100 communicate with each other via system bus 120.

Signal acquisition module 122 contains circuitry and software that samples and digitizes logic signals 152 from device under test 131. Signal acquisition module 122 receives logic signals 152 from device under test 131 via channels 130. Signal acquisition module 122 includes a data sampling detector 138 that receives and digitizes logic signals 152. Preferably, samples of logic signals 152 are obtained at regular time intervals. The time interval may be operator-specified or synchronized with one of the logic signals 152 received from device under test 131, such a clock signal generated by DUT 131. Signal data 154 is a sampled and digitized representation of logic signals 152. The signal data acquisition module 122 also includes a buffer 132 that receives and temporarily stores signal data 154 from data sampling detector 138.

A trigger sequencer 134 selects the portion of signal data 154 for subsequent storage and display based on a operator-defined trigger specification 150. As noted, trigger specification 150 is specified generally by two parameters, a trigger definition that identifies the occurrences under which signal data is to be stored and a trigger position that identifies the relative position of the occurrence defined by the trigger definition. Trigger sequencer 134 stores in memory a predetermined quantity of signal data occurring before and after the specified occurrence. Trigger sequencer 134 provides switch control 159 to switch 136. Switch 136 allows passage of sample logic signals 154 from buffer 132 to a data storage memory 142.

Logic analyzer 100 also includes a video display controller 126. Computer platform 101 drives video display controller 126 using standard windows applications program interfaces (API) and display data from logic analysis module 140 to the operator on display 112 under the control of video display controller 126.

Logic analysis module 140 includes a trigger manager 180 that provides the operator with the ability to create and modify trigger specifications for capturing desired signal and bus information occurring at channels 130. Trigger manager 180 also enables the operator to store such trigger specifications and to recall stored trigger definitions for subsequent use and modification.

Figure 2:
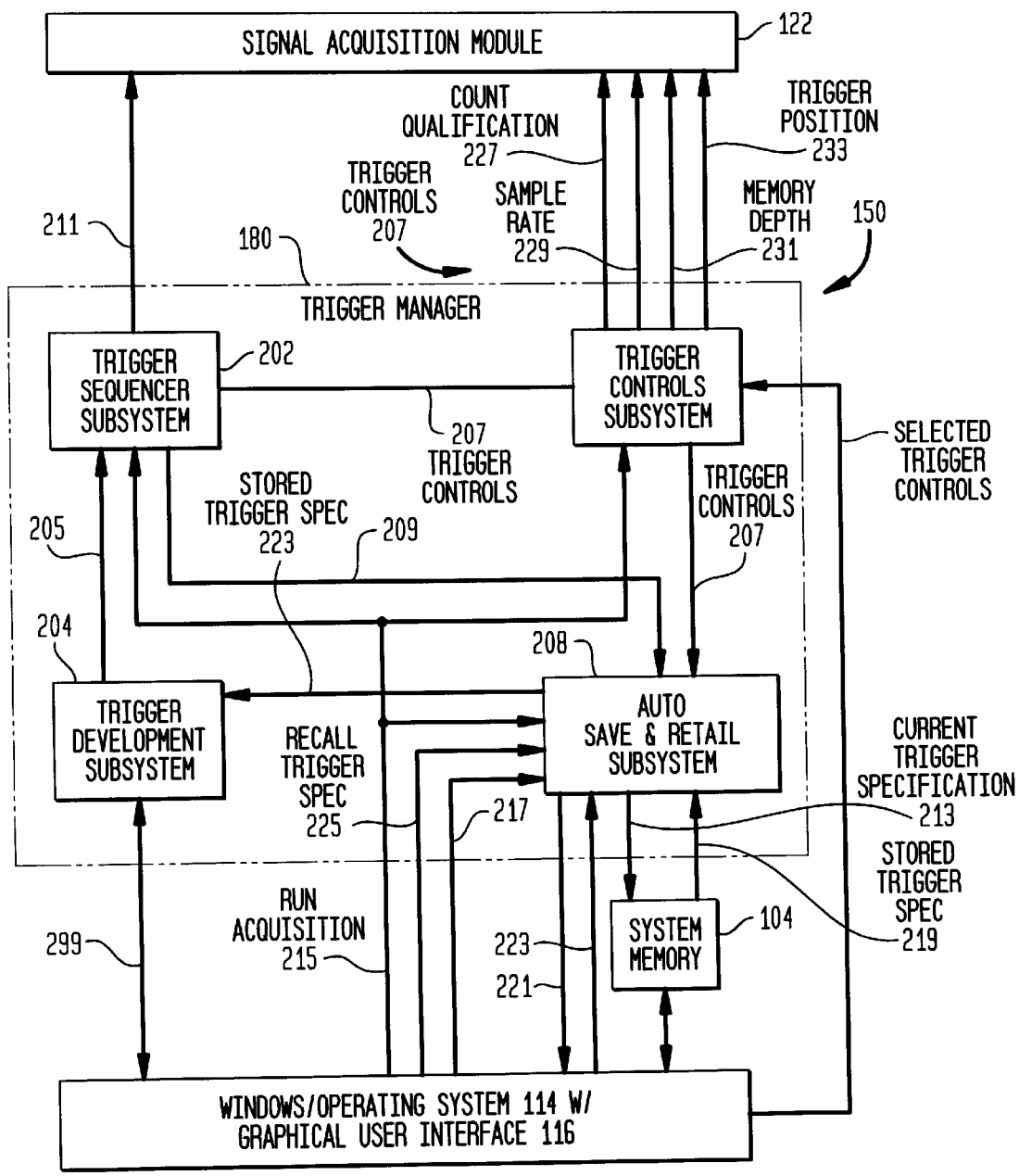
FIG. 2 is a functional block diagram of a trigger manager in which aspects of the present invention may be implemented.

FIG. 2 is a block diagram of one embodiment of trigger manager 180. Trigger manager 180 is shown to primarily include 4 functional subsystems or components. Specifically, trigger manager 180 includes a trigger development subsystem 204 that provides the operator with ability to develop trigger specifications through a user interface implemented as a graphical user interface 116 in the illustrative embodiment. A trigger sequencer subsystem 202 receives trigger sequences 205 from trigger development subsystem 204 and interprets trigger sequences 205 using trigger control information 207 received from trigger control system 206. Trigger sequencer 206 generates trigger definition signals 211 suitable for controlling signal acquisition module 122.

Trigger controls subsystem 206 enables the operator to specify the characteristics of the captured data, and provides such trigger controls 207 to signal acquisition module 122. Trigger controls 207 include, for example, count and store qualifications 227, 228, sample rate 229, memory depth 231 and trigger position 233. These trigger controls are considered to be well known in the art. Auto save and recall subsystem 208 provides for the automatic and operator-invoked storage of trigger specifications as well as the recall of such trigger specifications for subsequent use and modification. Auto save and recall subsystem 208 forwards stored trigger specification 223 to trigger development subsystem 204 for display on graphical user interface 116.

Figure 3:
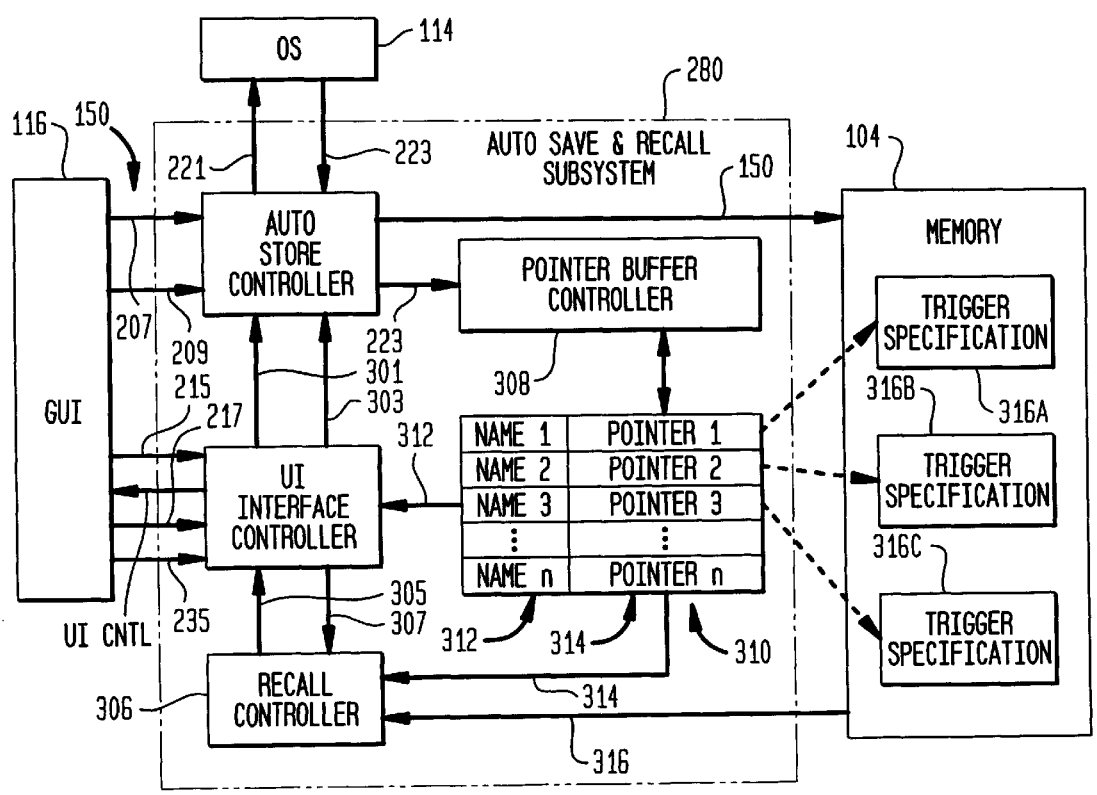
FIG. 3 is a functional block diagram of an automatic save and recall subsystem in accordance with one embodiment of the present invention.

FIG. 3 is a functional block diagram illustrating the primary components of one embodiment of the automatic save and recall subsystem 208 introduced above with respect to FIG. 2. As noted, auto save and recall subsystem 208 automatically stores a current trigger specification (or portion thereof) upon the occurrence of a predetermined condition other than an operator request (referred to herein as a "predetermined store condition"). Such a predetermined store condition may be defined by the occurrence of one or more events. In one preferred embodiment, such a predetermined condition is an operator's request to perform a measurement; that is, to run an acquisition. Significantly, this aspect of the present invention anticipates the needs of the operator to save a current trigger specification by saving all such trigger specifications that are utilized to acquire data. This aspect of the present invention will be described in greater detail below.

Auto save and recall subsystem 208 generally includes an auto store controller 302 and a recall controller 306 that communicate with graphical user interface 116 through user interface (UI) interface controller 304. In this illustrative embodiment, auto store controller 302 stores a current trigger specification 150 upon the occurrence of a run acquisition request 215. Recall controller 306 retrieves a specified trigger specification 316 stored in memory 104, providing it to trigger development subsystem 202 through graphical user interface 116. Once incorporated into trigger development subsystem 202, the operator can then edit or otherwise modify the retrieved trigger specification 316.

Auto store controller 302 and recall controller 306 access a pointer array 310 that stores pointers 314 to trigger specifications 316 stored in memory 104. Trigger specification names ("names") 312 are also stored in pointer array 310. Each name 312 provides a description of an associated pointer 314. In the illustrative embodiment, a plurality of trigger specifications 316 are stored in memory 104 as demonstrated by the 3 exemplary trigger specifications 316A, 316B and 316C shown in FIG. 3. Such trigger specifications 316 are stored sequentially; that is, they each were a "current" trigger specification at some previous time at which the predetermined store condition occurred. In such an embodiment, names 312 identify associated trigger specifications 316 by identifying a relative sequence in which the corresponding trigger specifications 316 have been stored.

A pointer buffer controller 308 is operationally interposed between auto store controller 302 and pointer array 310.

Pointer buffer controller 308 maintains an association between names 312 and pointers 314 in array 310 such that names 312 properly reflect the sequence in which the corresponding trigger specifications 316 and their associated pointers 314 have been stored.

Referring again to FIG. 3, a more specific description of a particular implementation of the present invention will now be described. As noted, auto store controller 302 stores a current trigger specification 150 upon the occurrence of a run acquisition request 215 and communicates with the graphical user interface 116 through user interface (UI) interface controller 304. As shown in FIG. 3 and noted above, trigger specification 150 includes trigger controls 207 and trigger definition 209, both of which are shown as being received by auto store controller 302.

In the illustrative embodiment, auto store controller 302 stores a current trigger specification 150 in response to a run acquisition request. Such a request is shown as being generated by graphical user interface 116 as run acquisition request 215, introduced above with respect to FIG. 2. In the illustrative embodiment, UI interface operations are consolidated in UI interface controller 304. In addition to performing other user interface operations described in detail elsewhere in the instant specification, UI controller 304 generates a run acquisition signal 303 in response to receipt of run acquisition signal 215. Run acquisition signal 215 is generated by graphical user interface 116 in response to the operator invoking a measurement. Such an invocation may be provided by graphically selecting a menu item, dedicated button, icon or the like. In embodiments that incorporate a user interface other than graphical user interface 116, an operator may invoke the performance of a measurement through a softkey selection item, dedicated button or other mechanism.

In one aspect of the present invention, the above automatic store and recall capabilities supplement a manual store capability. For example, auto store controller 302 also stores a current trigger specification 150 in response to a save signal 301 generated by UI interface controller 304 in response to a similar signal 217 generated by graphical user interface 116. Graphical user interface 116 generates manual save signal 217 in response to an operator explicitly requesting that a current condition be saved.

Upon receipt of run acquisition signal 303 and, in the illustrative embodiment, save request 301, auto store controller 302 stores trigger controls 207 and trigger definition 209 as current trigger specification 316 in memory 104. Auto store controller 302 generates a request for a sufficient amount of memory from operating system 114 through the generation of a request 221. In response to such a request, operating system 114 returns a pointer 223 to the allocated region in memory 104.

When the predetermined store condition occurs, auto store controller 302 forwards current trigger specification 150 to memory 104 for storage in a memory region starting at pointer 223. All or a portion of current trigger specification 150 is stored as a "trigger specification" 316 in memory 104. Pointer 223 is then forwarded to pointer buffer controller 308 for storage into pointer array 310. Pointer buffer controller 308 is described in detail below.

In an alternative embodiment, the selected predetermined store condition may comprise events other than an acquisition run request. For example, in one alternative embodiment of the invention, auto store control 302 stores current trigger definition 209 and trigger control 207 periodically; that is, at some predetermined interval of time. Such an approach shares the characteristic with the above approach of not having to require the operator to remember to perform the requisite actions to store the desired portion of the trigger specification. They also share the benefit of not interfering with the operator's concentration in the development of a desired trigger sequence.

FIG. 4 illustrates an exemplary trigger specification 316 that is stored in memory 104. As noted a current trigger specification 150 includes trigger definition 209 and trigger controls 207. In the illustrative embodiment, each of these is included in the trigger specification 316 that is automatically stored in memory 104 in accordance with aspects of the present invention.

Current trigger definition 209 is, as noted, the trigger sequence currently displayed on graphical user interface 116 when the operator runs a measurement. In addition, a number of trigger control parameters, or trigger controls 207 are stored a part of trigger specification 316. In the illustrative embodiment, trigger controls 207 includes trigger position 233 defining a relative position of the trigger condition and the signal data that is stored. In addition, a memory depth parameter 231 is stored as part of trigger controls 207. Memory depth 231 identifies the quantity of signal data that is to be stored upon the occurrence of the trigger condition. Sample rate parameter 229 identifies the frequency at which the signal data is sampled and stored. Count qualification parameter 227 provides tagging information that may be included in trigger controls 207. Store qualification parameter 228 identifies criteria applied to the sampled data to determine whether the sampled data should be stored or discarded.

It should be understood by those of ordinary skill in the art that different or additional trigger controls 207 may be included in trigger specification 316. Furthermore, it should be understood that trigger specification 316 may include a predetermined portion of the data shown in FIG. 4. For example, trigger specification 316 may include only trigger definition 209 and exclude all trigger controls 207. Alternatively, filters may be included to selectively store specific portions of trigger specification 150 upon the occurrence of different store conditions. For example, in response to the occurrence of a first store condition, trigger definition 209 is stored, while in response to a second store condition, the entire trigger specification 150 is stored.

FIG. 5 is an illustration of one embodiment of pointer array 310. As noted, pointer array 310 stores pointers 314 to trigger specifications 316 in memory 104 as well as corresponding names 312 that identify, in the illustrative embodiment, the chronological order in which associated trigger specifications 316 have been stored. As should be appreciated by those of ordinary skill in the art, any number of trigger specifications 316 may be stored in memory 104 and, therefore, pointer array 310 may include any number of pointers 314 and corresponding names 312.

In the illustrative embodiment, there are n pointers 314, pointer 1, pointer 2, pointer 3 . . . pointer n. The most recently saved trigger specification 316 is stored at a memory location identified by pointer 1. As shown in FIG. 5, the name associated with this pointer 1 is "previous run" meaning that the associated trigger specification 316A (FIG. 3) stored at this memory location is the trigger specification that was most recently implemented to acquire data.

Pointer 2 is a pointer to a memory location that stores the trigger specification 316B (FIG. 3) that was stored prior to the trigger specification 316A at pointer 1 memory location. Thus, the name 312 associated with pointer 2 is "2 runs ago." In other words, the trigger specification 316B stored at the memory location identified by pointer 2 is a trigger specification that was implemented to acquire data prior to the most recent data acquisition. Similarly, pointer 3 identifies the memory location at which trigger specification 316C (FIG. 3) that occurred "3 runs ago" is stored. In an alternative embodiment, names 312 may be provided not to identify the relative order in which a trigger specification 316 is stored, but to identify other characteristics such as, for example, the circumstances of the data acquisition.

As noted, pointer buffer controller 308 maintains an association between names 312 and pointers 314 in array 310 such that names 312 properly reflect the chronological order in which the trigger specifications 316 and their associated pointers 314 have been stored. In one illustrative embodiment, pointer buffer controller 308 updates pointers 314 associated with display names 312 when a new current trigger specification 316 is stored by auto store controller 302. In this illustrative embodiment, pointer array 310 is dynamically managed by pointer buffer controller 308 that updates pointers 314 associated with each name 312 to reflect the occurrence of the recent data acquisition.

Specifically, pointer n–1 is copied to pointer n, essentially overwriting or discarding pointer n. For example, referring to pointer array 310 illustrated in FIG. 5, pointer 3 would be copied to pointer n. Similarly, pointer 2 is copied to pointer 3 and pointer 1 to pointer 2. Pointer 223 is then saved as pointer 1. This quickly and simply dynamically updates pointer array 310 without moving trigger specifications 316 or interfering with the names 312 which are displayed on graphical user interface 116. In other words, pointer buffer controller 308 dynamically updates pointer array 310 by shifting pointers 314 so as to be associated with a name 312 that accurately reflects the chronological sequence at which the associated trigger specification 316 was stored.

It should become readily apparent from the instant description that pointer buffer controller 308 simply insures the proper association between names 312 and pointers 314 since names 312 impart a relative sequence. As noted, pointers 314 are dynamically assigned to names 312 to reduce the amount of data that is processed as well as to maintain a consistent interface with graphical user interface 116. In an alternative embodiment, other techniques may be implemented to insure graphical user interface 116 presents a predetermined number of indications of previously stored trigger specifications 316 and that a proper association between the displayed indications and the trigger sequences is maintained. For example, in an alternative embodiment, names 312 may be rearranged as additional trigger specifications 316 are stored by auto store controller 302.

As noted, recall controller 306 retrieves a stored trigger specification 316 specified by the operator, providing it to trigger development system 202 through graphical user interface 116. As will be described in detail below, the operator selects on graphical user interface 116 that a particular trigger specification 316 be recalled for editing. This selection results in the generation of recall trigger specification 235 by graphical user interface 116 that is received by Ul interface controller 304. Ul interface controller 304 generates a recall (buffer#) signal 307 for receipt by recall controller 306. Recall request 307 translates the identified buffer number (1st, 2nd, 3rd, etc.) to a trigger specification 316 stored in memory by accessing pointer array 310 to retrieve a pointer 314 associated with the identified trigger specification. For example, if the operator selects the third trigger specification, recall controller 306 accesses pointer array 310 and retrieves pointer 3 associated with the name 312 that identifies the selected trigger specification as that which was saved "3 runs ago." Recall controller 306 accesses memory 104 at the identified location and retrieves trigger specification 316C at that location, forwarding trigger specification 316 as stored trigger spec 305 to UI interface controller 304, which then presents the data to the GUI 116 for display.

Figure 6A:
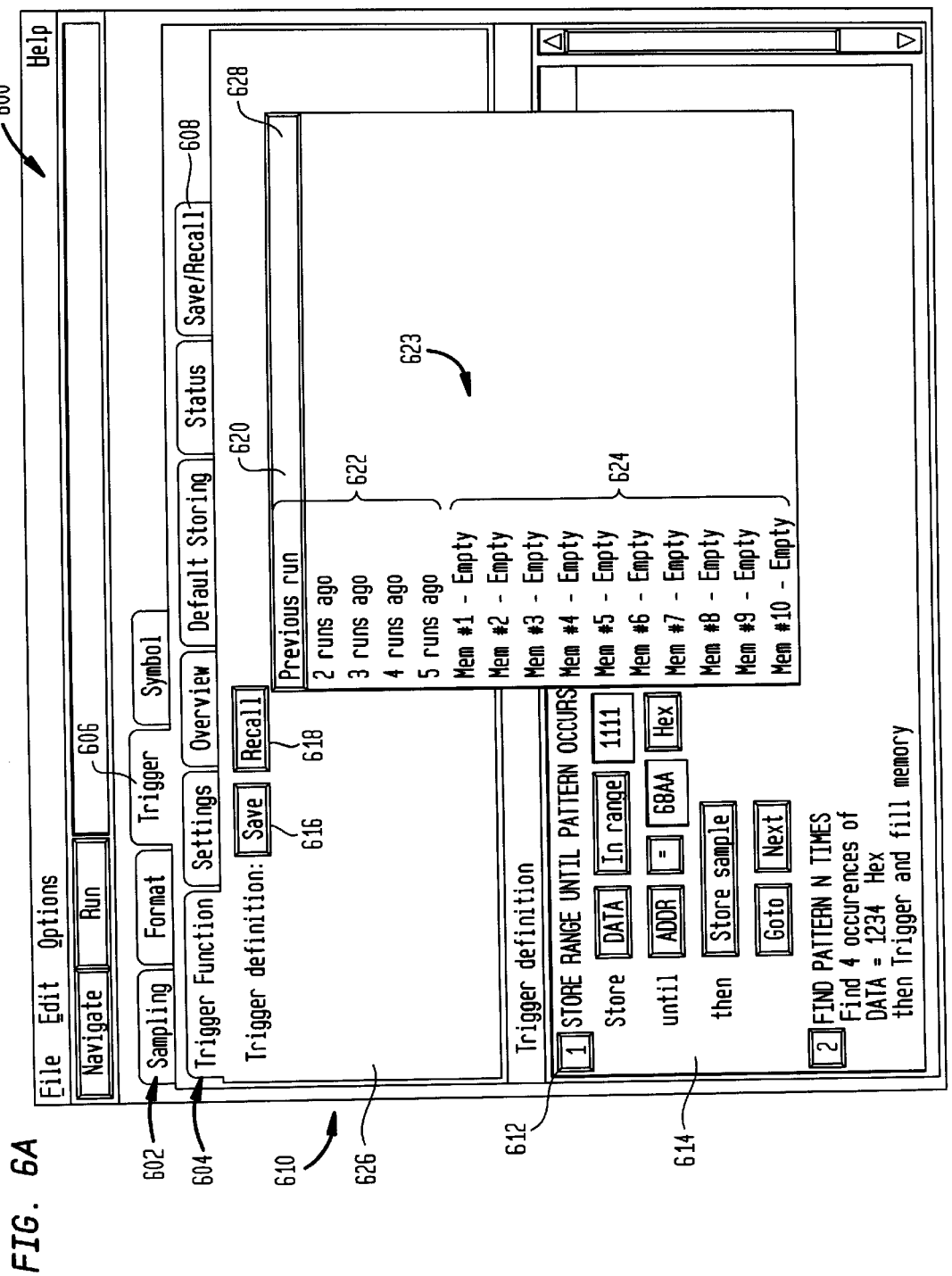
FIG. 6A is an illustration of a graphical user interface display in accordance with one embodiment of the present invention wherein an operator can automatically and manually save trigger specifications.

FIG. 6A is an illustration of a graphical user interface display in accordance with one embodiment of the present invention wherein an operator can automatically and manually save trigger specifications. As shown in FIG. 6A, a display 600 provides tabbed windows, each associated with a main function of logic analyzer 100. In this illustrative embodiment, a primary tier 602 of tabs is shown at the top of display 600. Trigger-related operations are easily found under a "trigger" tab 606, the graphical selection of which causes the display of a second tier 604 of tabs, all of which are related to trigger development in logic analyzer 100.

Selection of a "save/recall" tab 608 in tier 604 causes the display of a save/recall window 610. The displays associated with the illustrative embodiment of the present invention are found on window 610. Save/recall window 610 is divided primarily into two regions: a trigger definition region 614 and a trigger save/recall control region 626. Trigger definition region 614 provides the operator with a interactive environment in which to enter and edit a trigger definition. Many such interactive trigger definition development windows are possible and any known approach may be utilized. In the embodiment illustrated in FIG. 6A, a "store range until pattern occurs" trigger function is displayed as a current trigger definition.

Trigger save/recall control region 626 provides a save button 616 and a recall button 618 adjacent to a displayed text field entitled "Trigger definition:". Graphical selection of save button 616 by the operator causes auto store and recall subsystem 208 to save a current trigger definition displayed in trigger definition region 614. This feature of the illustrative embodiment of the present invention is described in greater detail below with reference to FIG. 6B.

Recall button 618 provides the operator with the ability to recall a previously stored trigger specification 316 from memory 104. Selection of recall button 618 results in the display of a pop-up menu, referred to herein as stored trigger specification pop-up menu 620.

Pop-up menu 620 includes a list 623 of trigger specification names which have been or may be stored in memory 104. In aspects of the invention in which the invention is provided as a supplement to a manual save system, a preferred approach is to provide all saved trigger specifications to the operator in a single location for review and selection. As such, trigger specification list 623 is divided into two sub-lists: a list 622 of automatically-stored trigger specifications and a sub-list 624 of manually-stored trigger specifications. As shown in FIG. 6A, in this embodiment of the present invention, five trigger specifications may be stored automatically while ten trigger specifications may be stored manually.

The trigger specification names displayed in automatically-stored trigger specification list 622 are those noted above with reference to FIGS. 3 and 5. That is, the default names given to the automatically-saved trigger specifications identify the relative chronological order in which the trigger specifications were saved.

The names illustrated in the manually stored trigger specification list 624 are shown to default to "MEM#n–Empty" as will be described in detail below, this name can be modified when an operator manually saves a trigger specification. In the embodiment illustrated in FIG. 6A, however, no such trigger specifications have been manually saved. Accordingly, sub-list 624 shows ten such default names.

Pop-up menu 620 is displayed to enable the operator to recall a desired trigger specification which has been previously stored in memory 104. The mechanism provided to the operator to graphically select a desired trigger specification is the highlight bar 628. In accordance with known graphical user interface techniques, the operator can manipulate the highlight bar to highlight and select the name of a desired trigger specification. Such an operation will cause the trigger definition of the selected trigger specification to be displayed in trigger definition region 614 of save/recall display window 610. In addition, the current trigger controls are updated with those stored in the selected trigger specification.

Figure 6B:
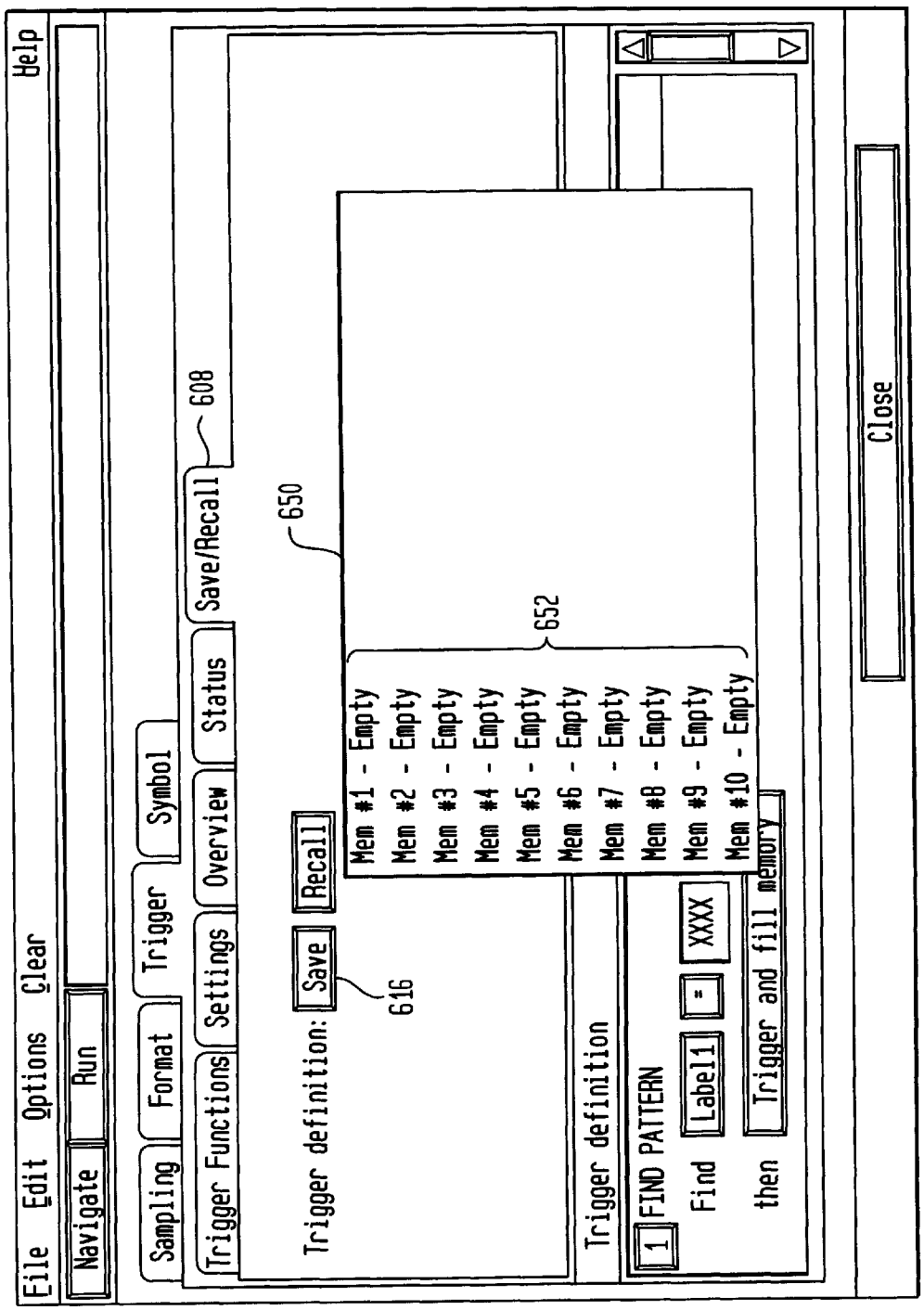
FIG. 6B is an illustration of a graphical user interface display in accordance with one embodiment of the present invention illustrating a pop-up menu displayed in response to an operator's invocation to manually save a trigger specification.

FIG. 6B is an illustration of a graphical user interface display in accordance with one aspect of the present invention illustrating a pop-up menu displayed in response to an operator's invocation to manually save a trigger specification. As shown in FIG. 6B, selection of save button 616 causes the display of a pop-up menu, referred to herein as save trigger specification pop-up menu 650. Pop-up menu 650 contains a list of available pointer entries in pointer array 310 that may point to a trigger specification that is manually saved. The default names in list 652 are as described above with reference to FIG. 6A. Graphical selection of one of the display elements in list 652 causes a predetermined portion of the current trigger specification, including the trigger definition displayed in trigger definition region 614, to be stored in the selected buffer. At such time, conventional graphical techniques are implemented to enable the operator to change the name of the manually saved trigger specification from its default name to some other desired name.

It should be understood that the graphical user interface displays illustrated in FIGS. 6A and 6B are exemplary only. For example, in the illustrative embodiment, the display elements are in the form of buttons and window tabs. It should be understood that tabs 606, 608, tab tiers, 602, 604 and buttons 616 and 618 are simply one of numerous approaches that may be used to present display elements for selection or data entry by the operator. Such display elements may be provided in accordance with graphical user interface display techniques now or later developed. For example, icons, menu lists, pop-up menus, scroll lists, and other such graphical display elements may be used in any combination to present the same or similar information to the operator. All such implementations are considered to be well known in the relevant art and are also considered to be within the scope of the present invention.

It should also be understood, that, as noted, aspects of the present invention do not necessarily include the ability to manually save trigger specifications. In such aspects, save button 616 and its associated pop-up menu 650 and sub-list 624 would not be presented on the graphical interface user displays of FIG. 6A and FIG. 6B. Only recall button 618 or its equivalent in the implemented user interface is required to be provided to the operator, along with an indication of saved trigger specifications from which the operator can select a desired trigger specification to recall. Modifying the graphical user interface displays to accommodate various aspects of the present invention is considered to be within the preview of those of ordinary skill in the art.

The alternative embodiment wherein the operator then has the capability of manually storing the trigger specification provides additional benefits to those noted above. One benefit is the ability to determine whether a trigger specification is one that will be accessed at some later date, in which case the operator would manually store the trigger specification, to avoid the potential loss of an automatically-stored trigger sequence, as there may be a limited number of automatically-stored trigger sequences supported by the implemented invention. In other words, as noted above, the automatically-saved trigger specifications are eventually overwritten with more recent trigger specifications. On the other hand, manually-stored trigger specifications are permanently stored until overwritten by the operator. The operator can then retain the trigger specification indefinitely and, once it is determined that it is no longer desired, the operator can purposely delete it.

The present invention is not limited to implementation with a particular user interface. For example, logic analyzer 100 or other signal measurement system may have a user interface embodied with a flat panel and softkeys. In such an embodiment, the names for the stored trigger specifications may be presented adjacent to specific soft keys enabling the user to select the desired trigger specification for recall by depressing the associated soft key.

In another embodiment, the user interface may be dedicated controls on a front panel of the signal measurement system. In such an embodiment, controls such as buttons, keys or rotary switch positions are provided for each of the stored trigger sequences. Selection of a desired trigger sequence through the manipulation of the dedicated controls would cause the recall of the desired trigger specification.

It should also be understood that logic analyzer 100 may be remotely controlled. In such an embodiment, one of input/output cards 106 is a network interface card (NIC). Logic analyzer 100 (or other signal measurement system hosting the invention) provides the operator with a display of the stored trigger sequences over the network through the NIC 106. Any technique now or later developed may be used to communicate data and control to a remote location on a network that includes the signal measurement system hosting the present invention.

FIG. 7 is a high level flow chart of automatic save and recall processes performed in accordance with one embodiment of the present invention. Process 700 begins at start block 702 in response to the occurrence of a predetermined store condition. As noted, this predetermined store condition may include any number of events and explicitly excludes the operator requesting that a current trigger specification be stored. Upon the occurrence of such a store condition, processing continues at block 704 at which the current trigger specification is automatically stored. As used herein the stored "trigger specification" may include, as noted, all or a portion of a current trigger specification 150.

At block 706, the present invention provides an indication of a predetermined number of previously-stored trigger specifications on a user interface. In the exemplary embodiment described above, a graphical user interface was utilized to provide such an indication. However, as one skilled in the relevant art would find apparent, other such user interfaces may be implemented in a signal measurement system in general, and logic analyzer 100 in particular. As such, at block 706, the present invention provides an indication suitable for the implemented user interface.

A stored trigger specification identified by the operator is recalled from memory and presented to the operator as a current trigger specification for editing at block 708. Again, the operator would utilize the implemented user interface to select a desired stored trigger specification to be recalled. Processing then ceases at end block 710.

FIG. 8 is a high level flow chart of an alternative embodiment of processes performed to automatically save and recall predetermined portions of a trigger specification. In this embodiment, automatic save and recall process 800 is invoked at block 802 after which a current trigger specification (or portion thereof is automatically stored when a signal acquisition is invoked at block 804. The processes represented by this block may be performed to store any desired number of trigger definitions.

Operator access to a predetermined number of previously-stored trigger specifications is provided at block 806. Any mechanism for providing the operator such access may be used. Given that access, an operator may retrieve any desired trigger specification for memory 104. Processing then ceases at end block 808.

FIG. 9 is a high level flow chart of the processes performed in accordance with one embodiment of the present invention to automatically store a desired portion of a trigger specification. Process 900 may be performed at, for example, block 704 in FIG. 7 or block 804 in FIG. 8. After begin block 902, selected trigger specification data is stored in memory at block 904. This data may include a trigger definition as well as any number of trigger control parameters, as described above. Once this data is stored, processing continues at block 906 at which pointer array 310 is updated to reflect the storage of the current trigger specification data at block 904. The pointer array 310 may be updated using any known technique to insure the proper association between the pointers and corresponding trigger specification data and name. The storage process then ceases at block 908.

FIG. 10 is a detailed flow chart of the processes performed in accordance with one embodiment of the present invention to automatically store a trigger specification. Once a determination has been made to save a current trigger specification, processing advances from start block 1002 to block 1004 at which the desired current trigger specification data is retrieved. Such retrieval may require the auto save and recall subsystem 208 to access various other subsystems or memory devices in logic analyzer 100. When such data is retrieved, a memory region of sufficient size is allocated at block 1006 to store the retrieved data.

At block 1008 the current trigger specification data which has been retrieved at block 1004 is stored in the memory region allocated at block 1006. A pointer in the pointer buffer is set to point to the allocated memory region at block 1010. Processing then ceases at block 1012.

FIG. 11 is a high level flow chart of the processes performed by the present invention to recall a previously saved trigger specification. Upon the operator request to recall a specific trigger specification 316, processing advances from start block 1102 to block 1104 at which the graphical user interface screen updates are prevented. At block 1106 the current trigger specification is set equal to the selected stored trigger specification. That is, the selected store trigger specification is retrieved or copied from memory and presented to the operator as a current trigger specification. Once this is accomplished, then screen updates are allowed at block 1108. Processing then ceases at block 1110.

FIG. 12 is a detailed flow chart of the processes performed by the present invention to recall a previously saved trigger specification. After block 1202, screen updates are prevented at block 1204. A pointer for the selected trigger specification is retrieved at block 1206 which identifies the region in memory 104 at which the selected trigger specification is located. That selected trigger specification is then retrieved at block 1208 and forwarded to the user interface at block 1210. Once the user interface has been updated, screen updates are allowed at block 1212. Processing then ceases at block 1214.

Figure 13:
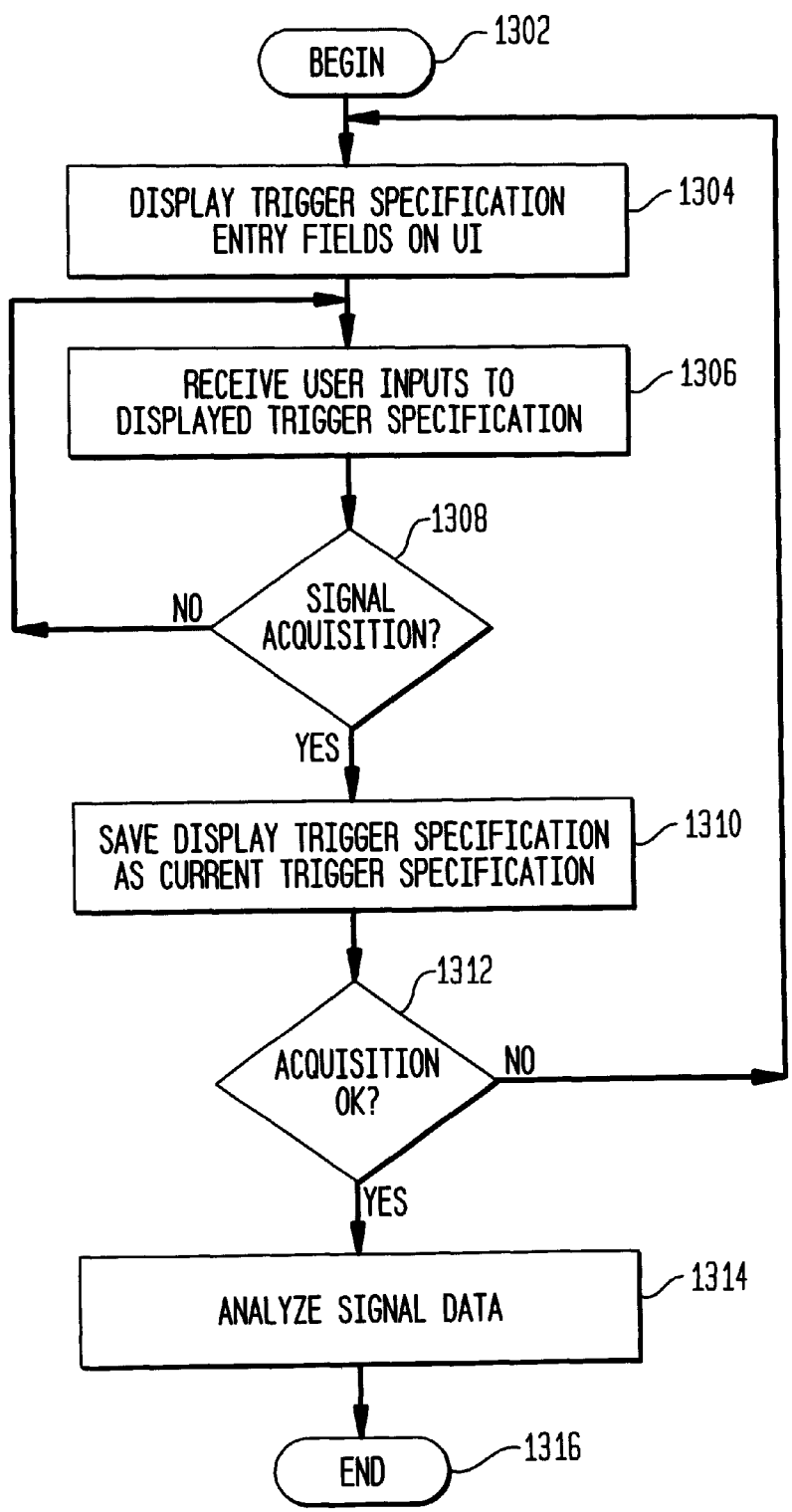
FIG. 13 is a flow chart of an exemplary implementation of processes performed at a user interface in accordance with one embodiment of the present invention.

FIG. 13 is a flow chart of an exemplary implementation of processes performed at a user interface in accordance with one embodiment of the present invention. After begin block 1302 trigger specification entry fields are displayed on user interface at block 1304. At block 1306 an operator's inputs to the display trigger specification are received. If such inputs include signal acquisition, as determined at block 1308, the processing continues at block 1310. Otherwise, processing continues at block 1306 where additional operator inputs may be received. This process continues until one of the operator inputs indicates that a signal acquisition is desired. Upon such an occurred, the displayed trigger specification is saved to memory as a current trigger specification at block 1310. As noted, all or a portion of the display trigger specification may be saved to memory.

At block 1312 the operator evaluates the performance of the acquisition. If it is as anticipated then the operator may analyze the data at block 1314. If it is not, then processing continues again at block 1304 at which the trigger specification entry fields are once again displayed on the user interface. The above process is then continued until the operator determines that the acquisition was as anticipated at block 1312. After such an occurrence, the operator may analyze the signal data at block 1314 as noted above. Processing then ceases at block 1316.

While various embodiments of the present invention have been described above, it should be understood that they have been presented by way of example only, and not limitation. For example, exemplary aspects of the present invention have been described in relation to a logic analyzer. It should be apparent to those of ordinary skill in the art that the present invention may be implemented in any signal measurement system that acquires and stores signal data in accordance with a trigger specification. For example, the present invention may be implemented in a digital oscilloscope, protocol analyzer, microprocessor emulator, bit error rate tester, network analyzer, etc. Furthermore, trigger-related data stored in memory 104 has been described as being a current trigger specification or portion thereof. In alternative embodiments, trigger-related data or, as described above, trigger specification 316 includes trigger-related data that is not traditionally included as being part of a trigger specification. In addition, the above description provided the user interface provision that enables an operator to recall a selected trigger specification to be displayed in a single window 610 with the displayed current trigger definition. This is optional and, in certain circumstances, preferred, since the operator can select a trigger specification and immediately begin editing or evaluating it on display 600. Alternative display approaches may, of course, be implemented. Thus, the breadth and the scope of the present invention are not limited by any of the above exemplary embodiments, but are defined only in accordance with the following claims and their equivalents.

What is claimed is:

1. A system for use in a signal measurement system that acquires and stores signal data in accordance with a current trigger specification, said current trigger specification including a trigger definition and trigger control parameters, said system constructed and arranged to automatically save a specified portion of the current trigger specification in response to an occurrence of a predetermined store condition that does not include operator requests to store said current trigger specification, and to provide subsequent access to a predetermined number of said specified trigger specification portions for subsequent recall.

2. The system of claim 1, wherein said predetermined store condition is an operator's attempt to acquire data.

3. An auto save and recall system for use in a signal measurement system that acquires and stores signal data in accordance with a trigger specification, the system constructed and arranged to store a predefined portion of a current trigger specification automatically and in response to operator-invoked requests, and to provide operator access to a predetermined number of said stored predefined trigger specification portions for subsequent recall and use by the operator.

4. An auto save system for use in a signal measurement system that acquires and stores signal data in accordance with a trigger specification, the signal measurement system having a user interface and a memory device, the system constructed and arranged to automatically store current trigger-related data in a region of memory operationally coupled to the system, wherein a predetermined number of said memory regions are accessible for subsequent recall of previously-stored trigger-related data from memory.

5. The system of claim 4, wherein said auto save system stores said triggerrelated data in response to an occurrence of a predetermined store condition that expressly excludes operator actions to store said trigger-related data.

6. The system of claim 5, wherein said predetermined store condition comprises an operator request to acquire signal data.

7. The system of claim 5, wherein said predetermined store condition comprises passage of a predetermined interval of time.

8. The system of claim 4, wherein said trigger-related data includes a portion of a current trigger specification.

9. The system of claim 8, wherein said portion of said current trigger specification comprises:

a current trigger definition; and one or more current trigger control parameters.

10. The system of claim 9, wherein said trigger definition defines a trigger sequence currently displayed on the user interface when the operator runs a measurement.

11. The system of claim 9, wherein said one or more current trigger control parameters define a manner in which said signal data is stored.

12. The system of claim 4, wherein said system comprises:

an auto store controller constructed and arranged to receive one or more inputs identifying events defining said predetermined store condition and to store in a region of the memory device said trigger-related data when said one or more event inputs indicate an occurrence of said predetermined store condition; and a recall controller constructed and arranged to retrieve from one of a plurality of memory device regions an operator-specified trigger-related data stored in response to a previous occurrence of said predetermined store condition and to provide said retrieved trigger-related data to the user interface.

13. The system of claim 12, wherein said system further comprises:

a pointer array, accessible by said auto store controller and said recall controller, that comprises:

a plurality of pointers each identifying one of said plurality of memory device regions; and a plurality of trigger names each associated with one of said plurality of pointers and providing a description of trigger-related data stored in a memory device region identified by said associated pointer.

14. The system of claim 13, wherein said trigger names indicate a relative sequence in which said corresponding trigger-related data have been stored.

15. The system of claim 14, further comprising:

a pointer buffer controller constructed and arranged to maintain an association between said trigger names and said pointers in said pointer array such that said trigger names reflect said relative sequence in which said corresponding triggerrelated data has been stored.

16. The system of claim 15, wherein said re call controller retrieves one of said pointers in said pointer array associated with a trigger name of said selected trigger name and accesses said memory device region identified by said pointer to recall said desired trigger-related data.

17. The system of claim 4, wherein said one or more current trigger control parameters comprises:

a trigger position defining a relative position of the trigger condition and the signal data that is stored;

a memory depth identifying a quantity of signal data that is to be stored in the memory device upon the occurrence of said store condition; and a sample rate identifying a frequency at which the signal data is sampled and stored upon said occurrence of said store condition.

18. The system of claim 4, wherein the signal measurement system is a logic analyzer.

19. The system of claim 4, wherein the signal measurement system is a digital oscilloscope.

20. A method for automatically saving and subsequently recalling a trigger definition in a signal measurement system that acquires and stores signal data in accordance with a trigger specification including a trigger definition and one or more trigger control parameters, the method comprising the steps of:

1) storing automatically a current trigger definition in response to a predetermined number of most recent signal acquisition requests; and 2) providing an operator access to said predetermined number of previously-stored trigger definitions.

21. The method of claim 20, wherein said step 1) comprises the steps of:

a) storing said trigger definition in a region of a memory device; and b) updating a pointer array to reflect the storage of said current trigger definition, said pointer array having stored therein pointers to memory regions in which trigger definitions are stored and names, each associated with and identifying a corresponding trigger definition.

22. The method of claim 20, wherein said step 1) comprises the steps of:

a) automatically storing, in response to an automatic store condition, said automatic store condition explicitly excluding operator invocation or other operator action associated with the storage of a trigger definition;

b) allocating a region portion of system memory of sufficient size to store said trigger definition;

c) storing said trigger definition in said allocated memory region; and e) setting a pointer in said pointer array to point to said allocated memory region.

23. The method of claim 20, wherein said step 2) comprises the steps of:
   a) receive an operator request to recall a specific trigger definition; and
   b) equating a current trigger definition to said selected stored trigger definition.

24. The method of claim 23, wherein said step 2) further comprises the steps of:
   c) before said step b), preventing screen updates to a user interface; and
   d) after said step b), allowing said screen updates.

25. The method of claim 23, wherein said step 2)b) comprises the steps of:
   (1) copying said selected stored trigger definition from said allocated memory region; and
   (2) presenting said retrieved trigger definition on said user interface as a current trigger definition.

26. The method of claim 25, wherein said step 2)b)(1) comprises the steps of:
   i) retrieving a pointer associated with said selected trigger specification from said pointer array, said retrieved pointer identifying said memory region at which the selected trigger specification is located;
   ii) retrieving said selected trigger definition from said memory region; and
   iii) forwarding said selected trigger definition to the user interface.

27. The method of claim 20, wherein the signal measurement system is a logic analyzer.

28. The method of claim 20, wherein the signal measurement system is a digital oscilloscope.

29. A method for automatically saving and recalling trigger-related data in a signal measurement system that acquires and stores signal data in accordance with a trigger specification, the method comprising the steps of:
   1) storing automatically trigger-related data that includes at least a trigger definition in a memory device, in response to an occurrence of a predetermined store condition that explicitly excludes operator invocation or other action associated with the storage of a trigger definition;
   2) providing an indication of a predetermined number of previously-stored trigger-related data on a user interface, each of said previously-stored trigger-related data stored in response to a prior occurrence of said predetermined store condition;
   3) retrieving from said memory one of said predetermined number of previously-stored trigger related data identified by the operator; and
   4) updating a current trigger specification to include said retrieved triggerrelated data.

30. The method of claim 29, wherein said trigger-related data further comprises:
   one or more trigger control parameters.

31. The method of claim 30, further comprising the step of:
   5) presenting on said user interface, said current trigger definition for modification by the operator.

32. The method of claim 29, wherein said user interface is a graphical user interface.

33. A method for automatically saving and recalling trigger-related data in a signal measurement system that acquires and stores signal data in accordance with a trigger specification, the signal measurement system having a graphical user interface, the method comprising the steps of:
   1) displaying on the graphical user interface a user-interactive trigger definition edit region;
   2) receiving operator's inputs to a current trigger specification having a trigger definition displayed in said trigger definition edit region;
   3) saving said current trigger definition including said trigger definition displayed in said trigger definition edit region to memory upon an occurrence of a signal acquisition request; and
   4) displaying an indication of previously stored trigger specifications on the graphical user interface.

34. The method of claim 33, further comprising:
   5) receiving a graphical selection input identifying specific trigger-related data stored trigger specifications;
   6) retrieving from said memory said selected trigger-related data; and
   7) displaying said trigger definition included in said retrieved trigger-related data in a trigger definition edit region of a current trigger definition.

35. An auto save system for use in a signal measurement system that acquires and stores signal data in accordance with a trigger specification, the signal measurement system having a user interface and a memory device, the system constructed and arranged to automatically store, in response to an occurrence of an operator request to acquire signal data, a current trigger specification in a memory operationally coupled to the system, and to store a predetermined number of said trigger specifications for subsequent recall from memory, the system comprising:
   an auto store controller constructed and arranged to receive one or more inputs identifying events defining said predetermined store condition, and to store in a region of the memory device said trigger-related data when said one or more event inputs indicate an occurrence of said predetermined store condition; and
   a recall controller constructed and arranged to retrieve, from the memory device region, operator-specified trigger-related data and to provide said retrieved trigger-related data to the user interface.

36. The system of claim 35, wherein said system further comprises:
   a pointer array operatively coupled to said auto store controller and said recall controller, comprising
      pointers to said memory device regions in which are stored trigger specifications that were saved in response to a predetermined number of prior signal acquisition requests, and
      trigger names each identifying a relative sequence in which trigger specifications corresponding to an associated pointer have been saved; and
   a pointer buffer controller constructed and arranged to maintain an association between said trigger names and said pointers in said pointer array such that said trigger names reflect said relative sequence in которой said corresponding trigger-related data has been stored.

* * * * *